United States Patent
Momo et al.

(10) Patent No.: US 11,942,431 B2
(45) Date of Patent: Mar. 26, 2024

(54) SEMICONDUCTOR DEVICE AND MANUFACTURING METHOD THEREOF

(71) Applicant: KIOXIA CORPORATION, Tokyo (JP)

(72) Inventors: Nobuyuki Momo, Yokkaichi Mie (JP); Keisuke Nakatsuka, Kobe Hyogo (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/874,565

(22) Filed: Jul. 27, 2022

(65) Prior Publication Data

US 2022/0367371 A1 Nov. 17, 2022

Related U.S. Application Data (63) Continuation of application No. 16/807,835, filed on Mar. 3, 2020, now Pat. No. 11,437,324.

(30) Foreign Application Priority Data

Sep. 17, 2019 (JP) ................. 2019-168887

(51) Int. Cl.
*H01L 23/538* (2006.01)
*H01L 23/482* (2006.01)
*H01L 23/522* (2006.01)
*H01L 25/00* (2006.01)
*H01L 25/065* (2023.01)
*H01L 27/07* (2006.01)
(Continued)

(52) U.S. Cl.
CPC ...... *H01L 23/5386* (2013.01); *H01L 23/4821* (2013.01); *H01L 23/5223* (2013.01); *H01L 25/0657* (2013.01); *H01L 25/50* (2013.01); *H01L 27/0733* (2013.01); *H01L 27/0805* (2013.01); *H01L 28/40* (2013.01); *H01L 28/60* (2013.01); *H01L 2224/0603* (2013.01); *H01L 2224/8034* (2013.01); *H01L 2924/1205* (2013.01); *H01L 2924/19041* (2013.01)

(58) Field of Classification Search
CPC ............ H01L 23/5386; H01L 23/4821; H01L 23/5223; H01L 25/0657; H01L 28/40; H01L 2224/8034
See application file for complete search history.

(56) References Cited

U.S. PATENT DOCUMENTS 9,437,572 B2 * 9/2016 Chen ................ H01L 21/324
2009/0108404 A1 4/2009 Kageyama
(Continued)

FOREIGN PATENT DOCUMENTS

CN 105190865 A 12/2015
CN 107615481 A 1/2018
(Continued)

*Primary Examiner* — Joseph C. Nicely
(74) *Attorney, Agent, or Firm* — Foley & Lardner LLP (57) ABSTRACT

According to one embodiment, a semiconductor device includes a first semiconductor chip including a first metal pad and a second metal pad; and a second semiconductor chip including a third metal pad and a fourth metal pad, the third metal pad joined to the first metal pad, the fourth metal pad coupled to the second metal pad via a dielectric layer, wherein the second semiconductor chip is coupled to the first semiconductor chip via the first metal pad and the third metal pad.

13 Claims, 5 Drawing Sheets

(51) Int. Cl.
  *H01L 27/08*   (2006.01)
  *H01L 49/02*   (2006.01)

(56) References Cited

U.S. PATENT DOCUMENTS

| | | |
|---|---|---|
| 2013/0082352 A1 | 4/2013 | Kim et al. |
| 2015/0348908 A1 | 12/2015 | Nagakura |
| 2016/0020235 A1 | 1/2016 | Yamashita |
| 2016/0043060 A1 | 2/2016 | Kabe et al. |
| 2016/0111386 A1* | 4/2016 | England .................. H01L 24/03 438/107 |
| 2016/0379960 A1* | 12/2016 | Huang .............. H01L 27/14636 257/432 |
| 2018/0138223 A1 | 5/2018 | Kotoo et al. |
| 2019/0115323 A1 | 4/2019 | Haba et al. |
| 2019/0123088 A1 | 4/2019 | Kwon |
| 2021/0028151 A1 | 1/2021 | Li et al. |
| 2021/0072191 A1* | 3/2021 | Kawadahara ........ G01N 29/043 |
| 2021/0090987 A1 | 3/2021 | Okano et al. |

FOREIGN PATENT DOCUMENTS

| | | |
|---|---|---|
| CN | 109698209 A | 4/2019 |
| JP | H06-021333 A | 1/1994 |
| JP | H06-252347 A | 9/1994 |
| JP | 3018017 B2 | 3/2000 |
| JP | 2003-258107 A | 9/2003 |
| JP | 2004-146814 A | 5/2004 |
| JP | 2009-111013 A | 5/2009 |
| JP | 2011-082301 A | 4/2011 |
| JP | 2011-114233 A | 6/2011 |
| JP | 2019-114595 A | 7/2019 |
| WO | WO-2014/184988 A1 | 11/2014 |

* cited by examiner

SEMICONDUCTOR DEVICE AND MANUFACTURING METHOD THEREOF

CROSS-REFERENCE TO RELATED APPLICATION(S)

The application is a continuation of U.S. patent application Ser. No. 16/807,835, filed Mar. 3, 2020, which is based upon and claims the benefit of priority from Japanese Patent Application No. 2019-168887, filed Sep. 17, 2019, the entire contents of which are incorporated herein by reference.

FIELD

Embodiments described herein relate generally to a semiconductor device and a manufacturing method thereof.

BACKGROUND

Publicly known capacitors that may be used in semiconductor devices have structures such as a metal-insulator-metal (MIM) structure, a metal-oxide-metal (MOM) structure, and a metal-oxide-semiconductor (MOS) structure.

Examples of related art include JP-B-3018017.

DETAILED DESCRIPTION

Embodiments provide a semiconductor device with a low-cost and small voltage-dependent capacitor configured to be highly integrated and have a large capacity and a method of manufacturing the semiconductor device.

In general, according to one embodiment, a semiconductor device includes a first semiconductor chip including a first metal pad and a second metal pad; and a second semiconductor chip including a third metal pad and a fourth metal pad, the third metal pad joined to the first metal pad, the fourth metal pad coupled to the second metal pad via a dielectric layer, wherein the second semiconductor chip is coupled to the first semiconductor chip via the first metal pad and the third metal pad.

Hereinafter, some embodiments of a semiconductor device will be described with reference to the drawings. In each of the embodiments, substantially the same constitutional parts are denoted by the same reference symbols, and descriptions thereof may be partially omitted in some cases. The drawings are outlines of the embodiments, and therefore, a relationship between thickness and plane dimensions, a ratio of thickness between parts, and other parameters, can differ from those in the case of an actual semiconductor device. The words and phrases for directions such as an upper direction and a lower direction in the descriptions show relative directions based on that a surface formed with a metal pad of a first semiconductor chip is on an upper side, unless otherwise noted. The relative directions may differ from actual directions based on the gravitational acceleration direction in some cases. The first semiconductor chip is described below.

Figure 1:
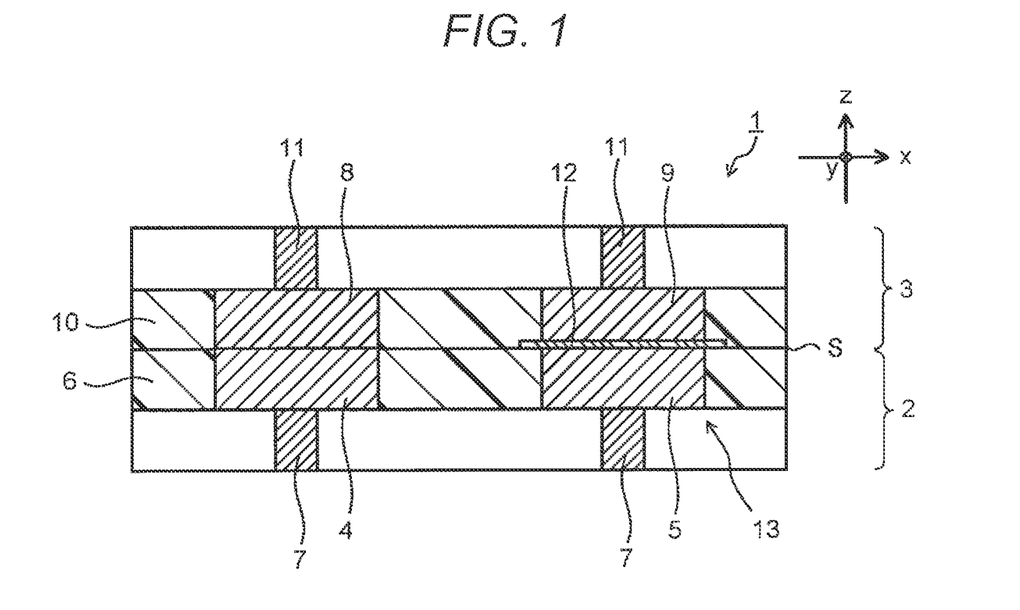
FIG. 1 is a sectional view illustrating a part of a semiconductor device according to an embodiment.

FIG. 1 is a sectional view illustrating a part of a semiconductor device 1 according to an embodiment. In FIG. 1, the right-left direction on the paper surface is represented as an "x" direction, the depth direction on the paper surface is represented as a "y" direction, and the upper-lower direction on the paper surface is represented as a "z" direction. The same applies to other drawings. The semiconductor device 1 illustrated in FIG. 1 includes a first semiconductor chip 2 and a second semiconductor chip 3. The first semiconductor chip 2 and the second semiconductor chip 3 are stacked on each other, thereby constituting the illustrated semiconductor device 1. The reference symbol S denotes a stack surface where the first semiconductor chip 2 and the second semiconductor chip 3 are in contact with each other. FIG. 1 illustrates an enlarged stack part at which the first semiconductor chip 2 and the second semiconductor chip 3 are stacked on each other. Each of the first semiconductor chip 2 and the second semiconductor chip 3 includes a wiring layer and a semiconductor element, such as a transistor, as described later.

The first semiconductor chip 2 includes a first metal pad 4, a second metal pad 5, and a first insulating layer 6 in which the first metal pad 4 and the second metal pad 5 are embedded. The first metal pad 4 and the second metal pad 5 are respectively coupled to wiring layers 7. The second semiconductor chip 3 includes a third metal pad 8, a fourth metal pad 9, and a second insulating layer 10 in which the third metal pad 8 and the fourth metal pad 9 are embedded. The third metal pad 8 and the fourth metal pad 9 are respectively coupled to wiring layers 11. Although the first insulating layer 6 is provided with only the first metal pad 4 and the second metal pad 5 as an example in this embodiment, the first insulating layer 6 is provided with multiple metal pads. Similarly, although the second insulating layer 10 is provided with only the third metal pad 8 and the fourth metal pad 9, metal pads that are respectively coupled to the multiple metal pads provided to the first insulating layer 6, are provided to the second insulating layer 10. The first metal pad 4 and the third metal pad 8 are respectively coupled to the wiring layers 7 and 11 herein, but the first metal pad 4 and the third metal pad 8 may be dummy pads that are not coupled to wiring layers.

The first metal pad 4 and the third metal pad 8 contribute to stack of the first semiconductor chip 2 and the second semiconductor chip 3. The first insulating layer 6 and the second insulating layer 10 also contribute to stack of the first semiconductor chip 2 and the second semiconductor chip 3. That is, an exposed surface of the first metal pad 4 at the surface of the first semiconductor chip 2 and an exposed surface of the third metal pad 8 at the surface of the second semiconductor chip 3 are directly jointed to each other by a force such as a Van der Waals force. Moreover, an exposed surface of the first insulating layer 6 at the surface of the first semiconductor chip 2 and an exposed surface of the second insulating layer 10 at the surface of the second semiconductor chip 3 are directly joined to each other by a force such as a Van der Waals force. Thus, the first semiconductor chip 2 and the second semiconductor chip 3 are stacked.

FIG. 1 illustrates an interface between the first metal pad 4 and the third metal pad 8 and an interface between the first insulating layer 6 and the second insulating layer 10 for convenience of explanation. However, the first metal pad 4 and the third metal pad 8 are directly joined into one body while the first insulating layer 6 and the second insulating layer 10 are directly jointed into one body, and thus, there may be cases in which no visually recognizable interface exists. Nevertheless, it is possible to confirm the stack of the first semiconductor chip 2 and the second semiconductor chip 3 by analyzing a cross section of the semiconductor device 1. The first to the fourth metal pads 4, 5, 8, and 9 use copper or copper alloy or may be made of other metal material. The first insulating layer 6 and the second insulating layer 10 use silicon oxide ($SiO_2$), silicon oxynitride (SiON), or silicon nitride ($Si_3N_4$) or may be made of other insulating material. The first insulating layer 6 and the second insulating layer 10 are preferably made of an inorganic insulating material such as a metal oxide, a metal oxynitride, or a metal nitride.

The first semiconductor chip 2 includes the second metal pad 5 that is not directly involved in stack. The second semiconductor chip 3 includes the fourth metal pad 9 that is not directly involved in stack. An insulating layer 12 is pad 9 as a dielectric layer. That is, the second metal pad 5 and the fourth metal pad 9 face each other via the insulating layer 12. The second metal pad 5, the fourth metal pad 9, and the insulating layer 12 constitute a capacitor 13 with a MIM structure. The insulating layer 12 may use each type of a dielectric material such as a high dielectric insulating material or a low dielectric insulating material. Examples of the high dielectric insulating material include silicon oxide ($SiO_2$), silicon oxynitride (SiON), silicon nitride ($Si_3N_4$), barium titanate ($BaTiO_3$), lead zirconate ($PbZrO_3$), lead titanate ($PbTiO_3$), and $HfO_2$. Examples of the low dielectric insulating material include fluorine-doped silicon oxide (SiOF) and carbon-doped silicon oxide (SiOC).

The capacitor 13 having a stacked structure of the second metal pad 5, the insulating layer 12, and the fourth metal pad 9 uses some of the multiple metal pads to be used in the metal stack process as electrodes (5, 9) of the capacitor 13, and therefore, the capacitor 13 is formed by only adding a process of forming the insulating layer 12 in the metal stack process. Thus, the capacitor 13 with the MIM structure is provided at low cost. A dielectric layer is provided between metal pads used as dummy pads that are not coupled to wiring among the multiple metal pads, in the stack process, whereby the metal pads are used as electrodes of a capacitor. Making the metal pads function as a capacitor at the wiring layers increases an area efficiency of the semiconductor chip. In this case, the metal pads are electrically coupled to wiring in order to use them as a capacitor. The capacitor 13 having the insulating layer 12 as the dielectric layer has an advantage that a capacitance per unit area that is able to be improved by selecting the component of the insulating layer 12 to increase a dielectric constant. The insulating layer 12 having a very large film thickness causes an excessively large difference in level, thereby making it difficult to stack the first semiconductor chip 2 and the second semiconductor chip 3 in the stack process. In view of this, the film thickness of the insulating layer 12 is preferably 5 nm or less. In the condition that the film thickness of the insulating layer 12 is 5 nm or less, the capacitor 13 is formed by disposing the insulating layer 12 between the second metal pad 5 and the fourth metal pad 9 without interrupting joining of the first metal pad 4 and the third metal pad 8.

Figure 2:
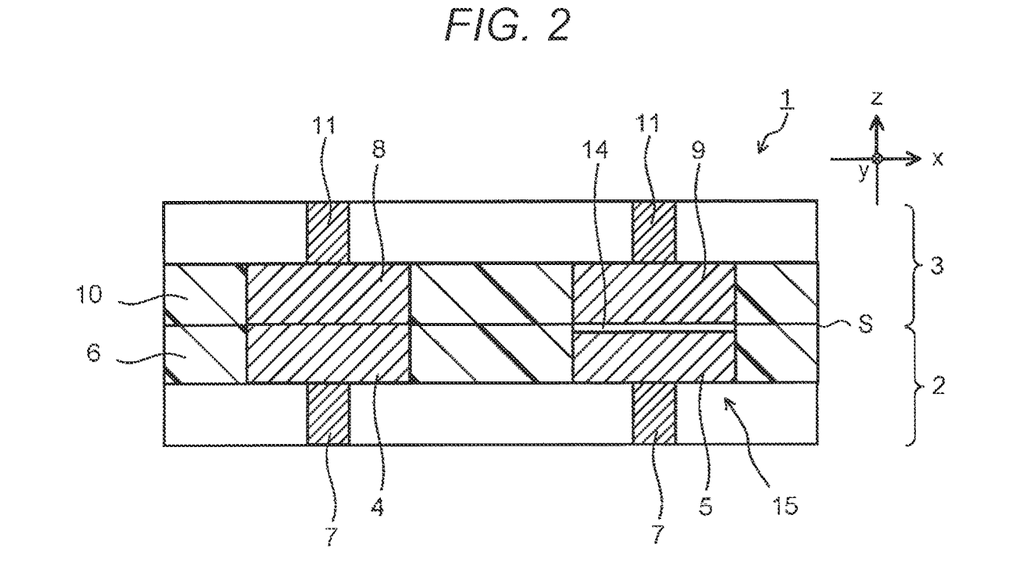
FIG. 2 is a sectional view illustrating other part of the semiconductor device according to the embodiment.

The dielectric layer of the capacitor 13 is not limited to the insulating layer 12. For example, as illustrated in FIG. 2, a gap layer 14, or in other words, an air gap, may be disposed between the second metal pad 5 and the fourth metal pad 9, as a dielectric layer. In this case, the second metal pad 5 and the fourth metal pad 9 face each other via the gap layer 14. The second metal pad 5, the fourth metal pad 9, and the gap layer 14 constitute a capacitor 15. The capacitor 15 having the air gap is superior in breakdown voltage. The depth of the gap layer 14 is preferably equal to or less of the film thickness of the adjacent metal pad, in forming the air gap capacitor 15.

Figure 5:
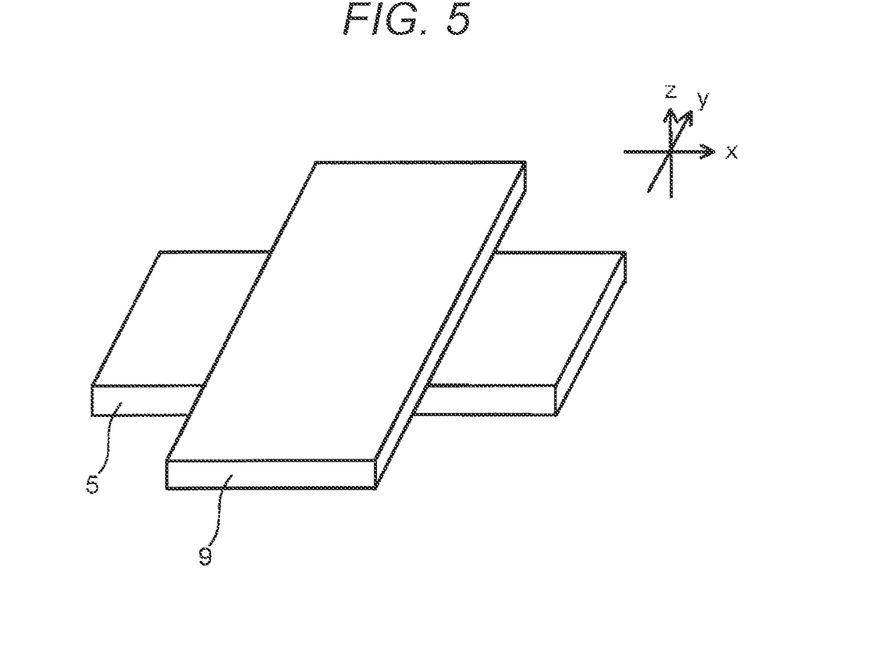
FIG. 5 is a perspective view illustrating a modification example of the semiconductor device according to the embodiment.

The shapes of the second metal pad 5 and the fourth metal pad 9 constituting the capacitor 13 or 15 may be a square shape as in the case of a metal pad in an ordinary stack process. In this case, there is a risk that the area of the capacitor 13 or 15 varies and causes variations in capacitance of the capacitor 13 or 15 when dislocation or misalignment occurs between the first semiconductor chip 2 and the second semiconductor chip 3. To avoid this risk, a second metal pad 5 and a fourth metal pad 9 having plane shapes as illustrated in FIG. 5 are effective. That is, the second metal pad 5 is preferably longer than the fourth metal pad 9 in an "x" direction parallel to the first semiconductor chip 2 and the second semiconductor chip 3, and the second metal pad 5 is preferably shorter than the fourth metal pad 9 in a "y" direction parallel to the first semiconductor chip 2 and the second semiconductor chip 3. At least one of these conditions is preferably satisfied, but it is more preferable to satisfy both of these conditions.

Figure 6A:
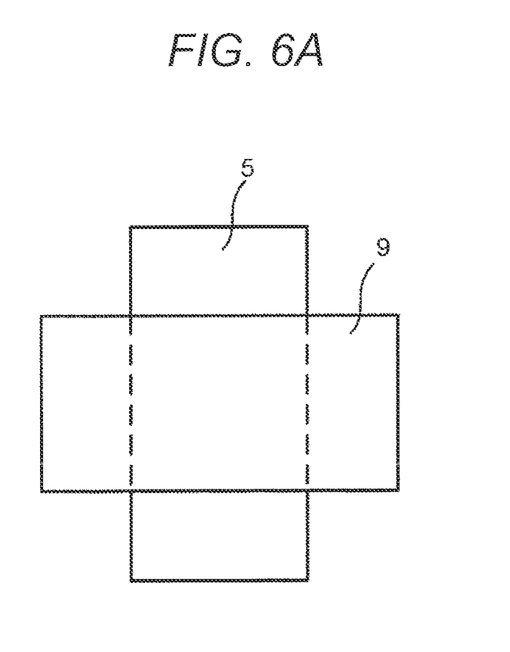
FIGS. 6A and 6B are plane views illustrating modification examples of the semiconductor device according to the embodiment.
Figure 6B:
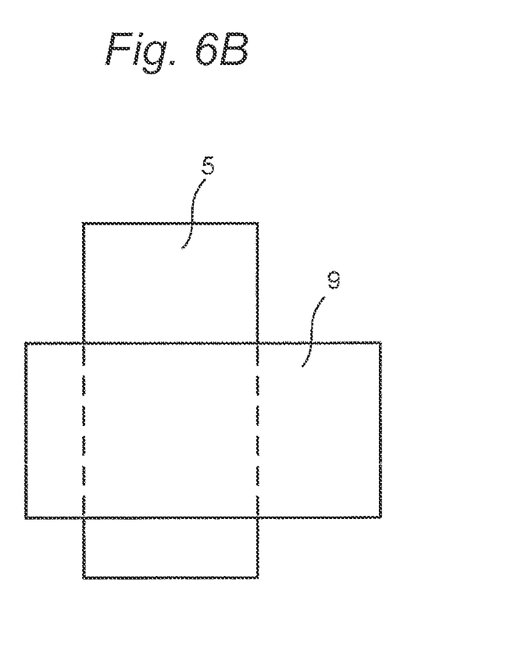

The second metal pad 5 and the fourth metal pad 9 having such plane shapes are preferably disposed so that the "x" direction of the second metal pad 5 and the "y" direction of the fourth metal pad 9 will perpendicularly cross each other. The dielectric layer, that is, the insulating layer 12 or the gap layer 14, may be provided on the second metal pad 5 that is longer than the fourth metal pad 9 in the "x" direction. That is, the dielectric layer may also be provided on a surface of the second metal pad 5 that does not overlap the fourth metal pad 9. Instead of the shapes of the example illustrated in FIG. 5, the second metal pad 5 may be longer than the fourth metal pad 9 in the "x" direction, while the second metal pad 5 may have approximately the same length as the fourth metal pad 9 in the "y" direction. Alternatively, the fourth metal pad 9 may be longer than the second metal pad 5 in the "y" direction, while the fourth metal pad 9 may have approximately the same length as the second metal pad 5 in the "x" direction. In this case, the dielectric layer may also be provided to a surface of the fourth metal pad 9 that does not overlap the second metal pad 5. Using the second metal pad 5 and the fourth metal pad 9 having such shapes enables maintaining a constant area where the second metal pad 5 and the fourth metal pad 9 that are disposed via the dielectric layer overlap each other, even when dislocation occurs between the second metal pad 5 and the fourth metal pad 9, as illustrated in FIGS. 6A and 6B. This provides capacitors 13 and 15 in which variations in capacitance are reduced.

Next, an example of an overall configuration of the semiconductor device 1 having the capacitor 13 or 15 illustrated in FIG. 1 or 2 is described with reference to FIG. 7. The semiconductor device 1 illustrated in FIG. 7 includes a stack of the first semiconductor chip 2 and the second semiconductor chip 3. Multiple metal pads including the first metal pad 4 and the second metal pad 5 are provided to the first semiconductor chip 2. The first semiconductor chip 2 may or may not include a semiconductor substrate. In this embodiment, a semiconductor device including a semiconductor substrate is described as an example. A single wiring layer or multiple wiring layers are formed on the semiconductor substrate, and the semiconductor device 1 includes multiple first elements 21 that are formed on the semiconductor substrate. Examples of the first element 21 include a transistor and a passive element. The first semiconductor chip 2 is provided with a memory cell. The memory cell is provided to an intersection part of multiple conductors and a pillar. The multiple conductors are stacked so as to be mutually separated from one another in the "z" direction. The pillar penetrates through the multiple conductors. The memory cell is composed of a pillar, a tunnel insulating film, a charge storage film, and a block insulating film, for example. The memory cell stores information. One of the multiple conductors constituting the memory cell is electrically coupled to the metal pad. A semiconductor element that is a part of the multiple first elements 21 has a gate electrode that is coupled to an end of the first wiring layer 7. The first wiring layer 7 may be coupled to a part other than the first element 21. The other end of the first wiring layer 7, which is coupled to the gate electrode of the first element 21 or other part, is coupled to the first metal pad 4 constituting the metal stacked part or to the second metal pad 5 constituting the capacitor 13.

Similarly, multiple metal pads including the third metal pad 8 and the fourth metal pad 9 are provided to the second semiconductor chip 3. The second semiconductor chip 3 is provided on the first semiconductor chip 2. The second semiconductor chip 3 may or may not include a semiconductor substrate. The second semiconductor chip 3 is provided with a single wiring layer or multiple wiring layers and is also provided with a semiconductor substrate. The second semiconductor chip 3 includes multiple second elements 22 that are formed on the semiconductor substrate. Examples of the second element 22 include a transistor and a passive element. A semiconductor element that are a part of the multiple first elements 22 has a gate electrode that is coupled to an end of the second wiring layer 11. The other end of each of at least some of the second wiring layers 11, which are coupled to the gate electrode of the second element 22 or other part, is coupled to the third metal pad 8 constituting the metal stacked part or to the fourth metal pad 9 constituting the capacitor 13. The second wiring layer 11 may couple between gate electrodes of the multiple second elements 22 and may couple between the third metal pad 8 and the fourth metal pad 9.

The coupling structure of the second wiring layer 11, as described above, also applies to the first wiring layer 7 of the first semiconductor chip 2, and each of the first wiring layer 7 and the second wiring layer 11 may form each type of circuit in accordance with the function of the semiconductor device 1. Although FIG. 7 illustrates the capacitor 13 having the insulating layer 12, off course, the capacitor 15 having the gap layer 14 may be used or the capacitors 13 and 15 may be used together. A dielectric layer is not provided between the metal pads that electrically couple the memory cell, which is provided to the first semiconductor chip 2, and the element, which is provided to the second semiconductor chip 3. That is, the metal pads that electrically couple the memory cell and the element are not used as a capacitor. Although not illustrated in the semiconductor device 1 in FIG. 7, the first semiconductor chip 2 includes a metal pad that is not coupled to the first wiring layer 7, and the second semiconductor chip 3 includes a metal pad that is not coupled to the second wiring layer 11 but is joined to the metal pad of the first semiconductor chip 2.

Figure 7:
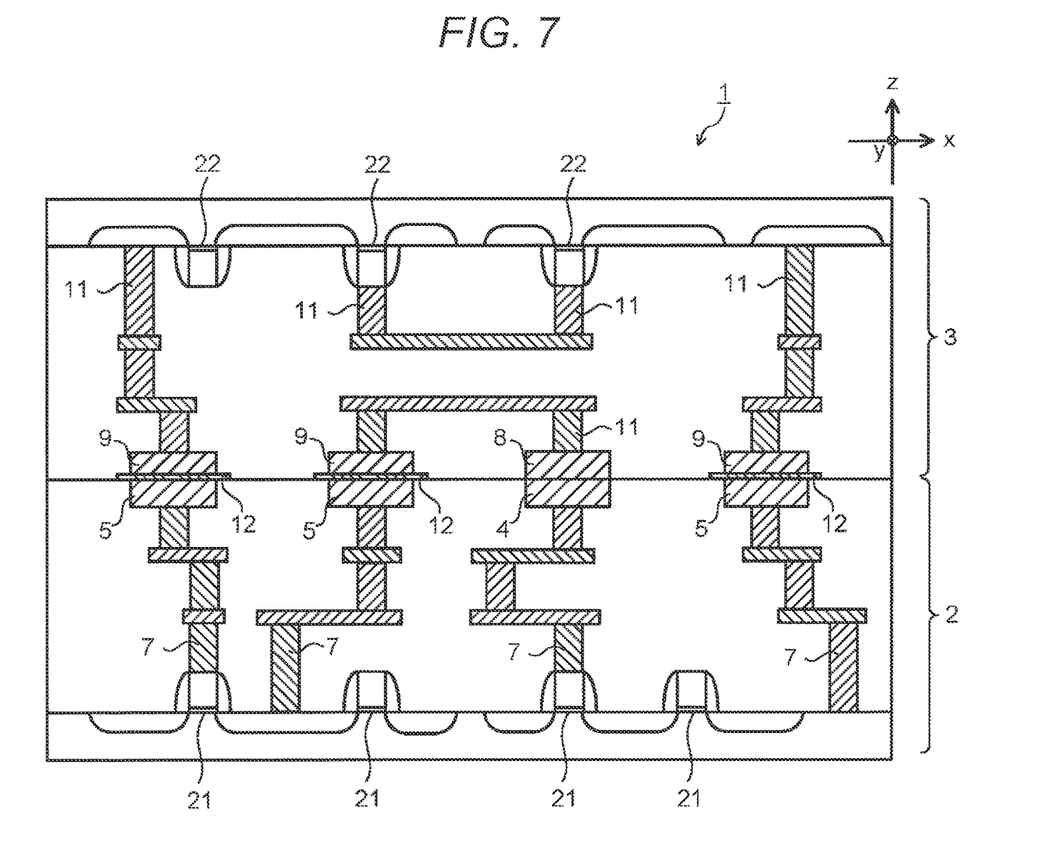
FIG. 7 is a sectional view illustrating an example of an overall configuration of the semiconductor device according to the embodiment.

In the semiconductor device 1 illustrated in FIG. 7, some of the first to the fourth metal pads 4, 5, 8, and 9, which originally constitute the metal stacked parts, are used to form the capacitor 13 or 15 with the MIM structure. Thus, the capacitors 13 and 15 that are superior in characteristics such as capacity per unit area, linearity, and voltage dependency, are obtained at low cost. Moreover, some dummy pads, which originally form the metal stacked parts, are used for the second metal pad 5 and the fourth metal pad 9 constituting the capacitor 13 or 15. Thus, the capacitors 13 and 15 are formed, as described above, without having to dispose new metal pads. This provides the semiconductor device 1 having one or both of the capacitors 13 and 15 without increasing the area for forming metal pads in the semiconductor device 1.

Figure 3A:
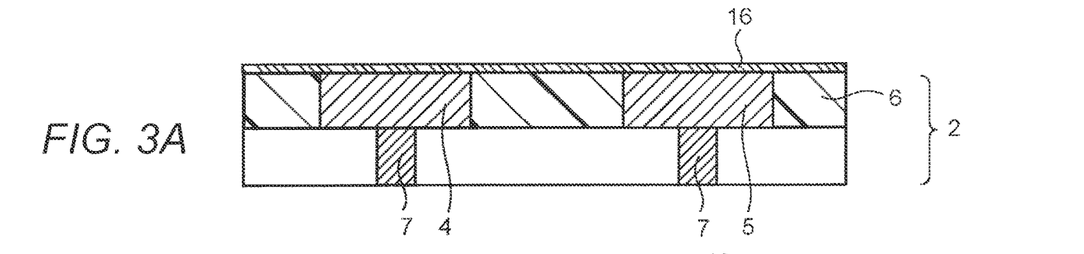
FIGS. 3A to 3D are sectional views illustrating a process of manufacturing the semiconductor device in FIG. 1.
Figure 3B:
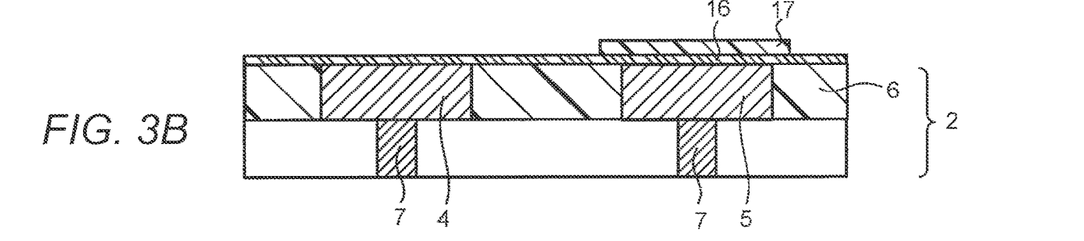

The semiconductor device 1 having the capacitor 13 illustrated in FIG. 1 is manufactured by the process, as illustrated in FIGS. 3A to 3D, for example. First, as in the case of an ordinary stack process, a first semiconductor chip or a semiconductor substrate 2 with a first metal pad 4, a second metal pad 5, and a first insulating layer 6 in which surfaces are exposed, is prepared. The surface of the first semiconductor chip or the semiconductor substrate 2 is flattened by chemical mechanical polishing (CMP), for example. An insulating film 16 to be used as a dielectric layer is deposited on such a flattened surface of the first semiconductor chip 2, as illustrated in FIG. 3A. Then, as illustrated in FIG. 3B, a mask layer 17 is formed in accordance with the shape of the insulating layer 12 of the capacitor 13 by a photo engraving process (PEP).

Figure 3C:
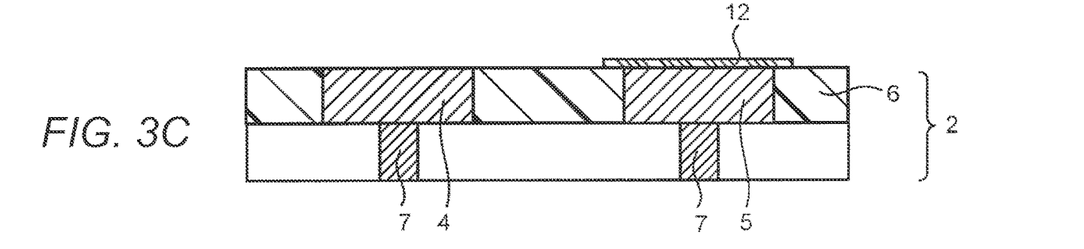
Figure 3D:
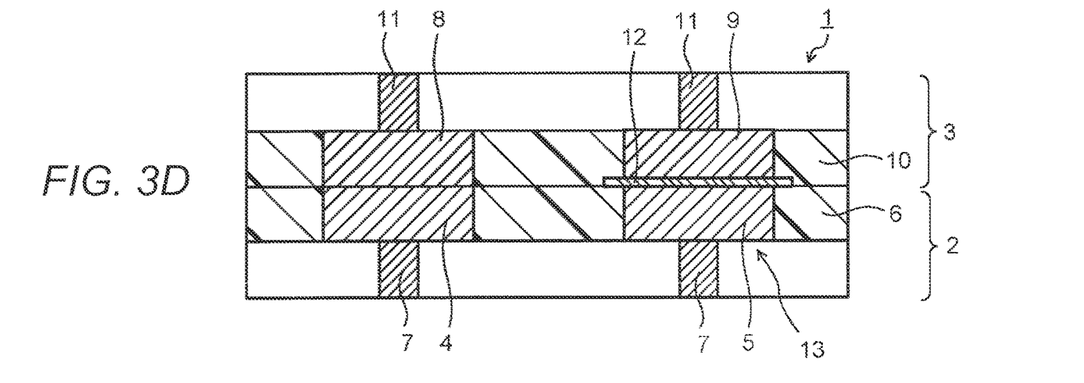

The mask layer 17 is used to remove an unnecessary part of the insulating film 16 by etching, whereby the insulating layer 12 is formed on the second metal pad 5, as illustrated in FIG. 3C. A second semiconductor chip or a semiconductor substrate 3 with a third metal pad 8, a fourth metal pad 9, and a second insulating layer 10 in which surfaces are exposed, is stacked on the first semiconductor chip or the semiconductor substrate 2 having such an insulating layer 12, as illustrated in FIG. 3D. The first semiconductor chip or the semiconductor substrate 2 and the second semiconductor chip or the semiconductor substrate 3 are stacked on each other by each type of publicly known stack method. The capacitor 13 is formed by only adding one PEP and one machining process to an ordinary stack process, and therefore, the manufacturing cost of the capacitor 13 is decreased.

Figure 4A:
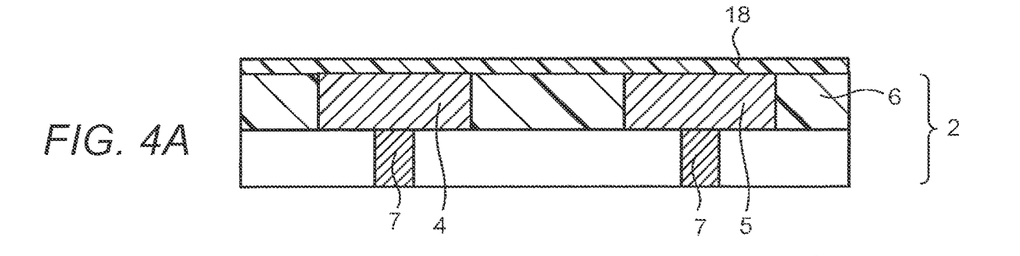
FIGS. 4A to 4D are sectional views illustrating a process of manufacturing the semiconductor device in FIG. 2.
Figure 4B:
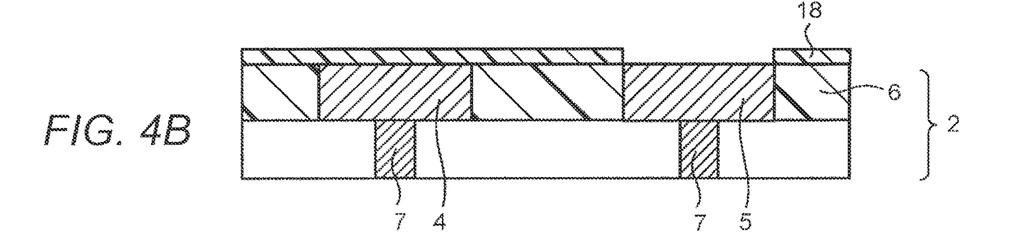
Figure 4C:
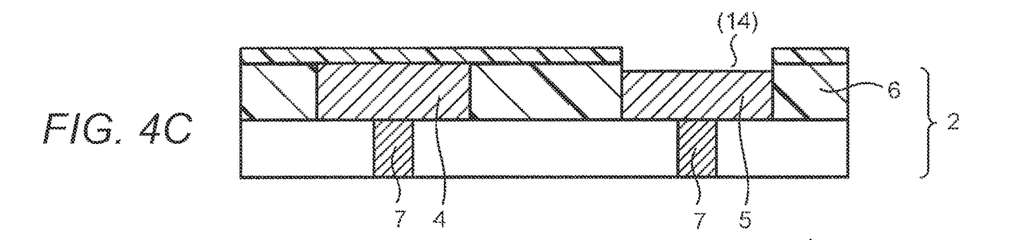

The semiconductor device 1 having the capacitor 15 illustrated in FIG. 2 is manufactured by the process, as illustrated in FIGS. 4A to 4D, for example. First, as in the case of an ordinary stack process, a first semiconductor chip or a semiconductor substrate 2 with a first metal pad 4, a second metal pad 5, and a first insulating layer 6 in which surfaces are exposed, is prepared. A mask layer 18 is formed on such a surface of the first semiconductor chip 2, as illustrated in FIG. 4A. Then, the mask layer 18 is partially removed in accordance with the shape of the second metal pad 5 by a PEP, to form an opening, as illustrated in FIG. 4B. The second metal pad 5 is partially removed in accordance with the opening of the mask layer 18 by etching, whereby the second metal pad 5 is recessed so as to form a gap layer 14, as illustrated in FIG. 4C. The gap layer 14 may be formed by selectively dishing the second metal pad 5 in flattening the surface of the first semiconductor chip or the semiconductor substrate 2 by CMP.

Figure 4D:
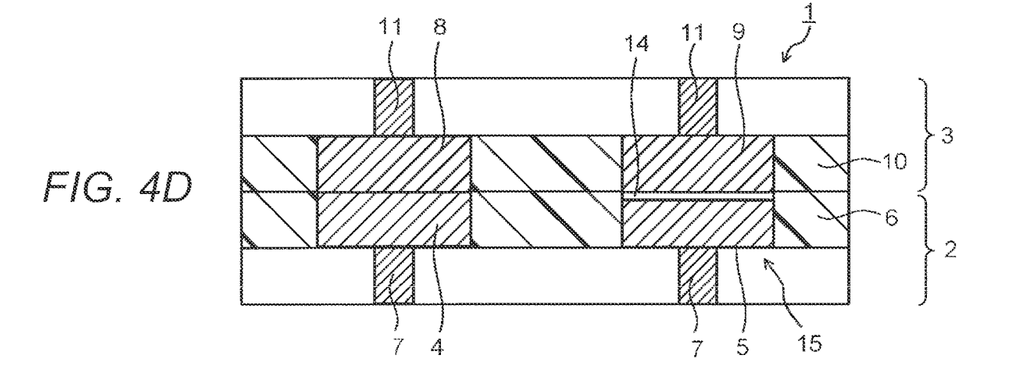

A second semiconductor chip or a semiconductor substrate 3 with a third metal pad 8, a fourth metal pad 9, and a second insulating layer 10 in which surfaces are exposed, is stacked on the first semiconductor chip or the semiconductor substrate 2 having such a gap layer 14, as illustrated in FIG. 4D. The first semiconductor chip or the semiconductor substrate 2 and the second semiconductor chip or the semiconductor substrate 3 are stacked on each other by each type of publicly known stack method. The capacitor 15 is formed by only adding one PEP and one machining process to an ordinary stack process or by using dishing in the CMP process, and therefore, the manufacturing cost of the capacitor 15 is decreased.

Each of the components of the foregoing embodiments may be used in combination or the components of the foregoing embodiments may be partially replaced with other component. While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a first semiconductor chip including a first metal pad and a second metal pad; and
   a second semiconductor chip including a third metal pad and a fourth metal pad, the third metal pad joined to the first metal pad, the fourth metal pad coupled to the second metal pad via an air gap, wherein the second semiconductor chip is coupled to the first semiconductor chip via the first metal pad and the third metal pad,
   wherein the first semiconductor chip includes a first semiconductor element and a first wiring layer, a first end of the first wiring layer is coupled to at least one of the first metal pad or the second metal pad, at least a portion of a second end of the first wiring layer is coupled to the first semiconductor element,
   the second semiconductor chip includes a second semiconductor element and a second wiring layer, a first end of the second wiring layer is coupled to at least one of the third metal pad or the fourth metal pad, and at least a portion of a second end of the second wiring layer is coupled to the second semiconductor element.

2. The semiconductor device according to claim 1, wherein the second metal pad and the fourth metal pad face each other via the air gap.

3. The semiconductor device according to claim 1, wherein the second metal pad is longer than the fourth metal pad in a first direction that is parallel with the first semiconductor chip and the second semiconductor chip.

4. The semiconductor device according to claim 1, wherein the air gap is provided on the second metal pad.

5. The semiconductor device according to claim 1, wherein the second metal pad is shorter than the fourth metal pad in a second direction that crosses a first direction, the first direction being parallel with the first semiconductor chip and the second semiconductor chip.

6. A semiconductor device comprising:
   a first semiconductor chip including a first metal pad, a second metal pad, and a third metal pad, the first metal pad being electrically coupled to a memory, the second metal pad being electrically coupled to a first wiring; and
   a second semiconductor chip, facing the first semiconductor chip, that includes a fourth metal pad, a fifth metal pad, and a sixth metal pad, the fourth metal pad having a first end electrically coupled to a first circuit and a second end coupled to the first metal pad, the fifth metal pad having a first end electrically coupled to a second circuit and a second end coupled to the second metal pad via an air gap, the sixth metal pad being coupled to the third metal pad.

7. The semiconductor device according to claim 6, wherein neither the third metal pad nor the sixth metal pad is electrically coupled to the first wiring.

8. The semiconductor device according to claim 6, wherein the second metal pad is longer than the fifth metal pad in a first direction that is parallel with the first semiconductor chip and the second semiconductor chip.

9. The semiconductor device according to claim 6, wherein the memory is provided in an intersection of multiple conductors and a pillar, the multiple conductors are stacked to be mutually separated from one another, and the pillar penetrates through the multiple conductors.

10. The semiconductor device according to claim 9, wherein at least one of the multiple conductors is electrically coupled to the first metal pad.

11. The semiconductor device according to claim 6, wherein and the second metal pad is shorter than the fifth metal pad in a second direction that crosses a first direction in parallel with the first semiconductor chip and the second semiconductor chip while being parallel to the first semiconductor chip and the second semiconductor chip.

12. A method for manufacturing a semiconductor device, comprising:
    providing a first semiconductor chip having a first metal pad and the second metal pad;
    forming a gap by recessing the second metal pad of the first semiconductor chip;
    disposing, on the first semiconductor chip, a second semiconductor chip including a third metal pad and a fourth metal pad so that the first metal pad and the third metal pad face each other and the second metal pad and the fourth metal pad face each other via the gap; and
    stacking the first semiconductor chip and the second semiconductor chip by joining the first metal pad and the third metal pad.

13. The method for manufacturing the semiconductor device according to claim 12, wherein the first semiconductor chip includes a first semiconductor element and a first wiring layer, a first end of the first wiring layer is coupled to at least one of the first metal pad or the second metal pad, at least a portion of a second end of the first wiring layer is coupled to the first semiconductor element,
    the second semiconductor chip includes a second semiconductor element and a second wiring layer, a first end of the second wiring layer is coupled to at least one of the third metal pad or the fourth metal pad, and at least a portion of a second end of the second wiring layer is coupled to the second semiconductor element.

* * * * *